(12) United States Patent
Alley

(10) Patent No.: US 8,009,078 B1
(45) Date of Patent: Aug. 30, 2011

(54) CONFIGURABLE ANALOG INPUT CHANNEL WITH GALVANIC ISOLATION

(75) Inventor: Daniel Milton Alley, Earlysville, VA (US)

(73) Assignee: General Electric Company, Schenectady, NY (US)

( * ) Notice: Subject to any disclaimer, the term of this patent is extended or adjusted under 35 U.S.C. 154(b) by 43 days.

(21) Appl. No.: 12/726,763

(22) Filed: Mar. 18, 2010

(51) Int. Cl.
*H03M 1/12* (2006.01)

(52) U.S. Cl. .................... 341/155; 375/355; 379/403

(58) Field of Classification Search .......... 341/120–155; 375/355; 379/403, 93.29, 93.31
See application file for complete search history.

(56) References Cited

U.S. PATENT DOCUMENTS

| | | | |
|---|---|---|---|
| 5,083,288 A | 1/1992 | Somlyody et al. | |
| 6,397,322 B1 | 5/2002 | Voss | |
| 6,996,200 B2 * | 2/2006 | Schubert et al. | 375/355 |
| 7,031,446 B2 * | 4/2006 | Wilson et al. | 379/93.29 |
| 7,088,818 B2 * | 8/2006 | Prendergast et al. | 379/403 |
| 7,223,014 B2 | 5/2007 | Lojen | |
| 2009/0131771 A1 | 5/2009 | Takeda et al. | |

OTHER PUBLICATIONS

Analog Devices Circuit Note CN0067, www.analog.com/en/verifiedcircuits/CN0067/vc.html, Jul. 2009, 2 pgs.

* cited by examiner

*Primary Examiner* — Lam T Mai
(74) *Attorney, Agent, or Firm* — Hoffman Warnick LLC; Ernest G. Cusick

(57) ABSTRACT

Embodiments of the invention relate generally to a configurable analog input channel with galvanic isolation. In one embodiment, the invention provides a configurable input channel for selectively receiving one of a plurality of different analog sensor inputs. The input channel includes an interface for implementing switch settings for a selected type of input signal; a set of input terminals, wherein at least two of the set of input terminals are selectively utilized to correspond with the selected type of input signal; an analog-to-digital converter for converting the input signal into a digital output, wherein an operation of the analog-to-digital converter is determined based on the switch settings; and an isolation barrier for isolating the configurable input channel.

14 Claims, 4 Drawing Sheets

| Input Type | Terminal 1 RTD1/+ | Terminal 2 RTD2/- | Terminal 3 RTD3 | Channel Switching | Measurement |
|---|---|---|---|---|---|
| Thermocouple | V1 input | V2 input | Not used | Disable current paths, Set up burnout detect paths, set high gain for span | Measure V1-V2, compare against burnout thresholds |
| RTD | Current 1 Output, V1 Input | Current 2 Output, V2 Input | Currents 1+2 Input, V3 Input | Enable 2 current paths, reference for A/D uses VB VA = V1-V2 VB = V3 = (I1+I2)*Rd | RTD = Rd*VA/VB |
| Current Loop | Current Input | Current Output | Not Used | Enable Ra path across T1, T2 | Current = (V1-V2)/Ra |
| Voltage | V1 input | V2 input | Not used | Disable current paths, set gain for span | Measure V1-V2, apply auto-ranging with span tracking |

Figure 2

CONFIGURABLE ANALOG INPUT CHANNEL WITH GALVANIC ISOLATION

BACKGROUND OF THE INVENTION

Embodiments of the invention relate generally to systems for sensing analog control data, and more particularly to a system having a universal input channel that is configurable to allow one of several different analog input types to be received via a single set of terminals.

In complex control systems, such as those that monitor turbines and the like, it is typically necessary to monitor or sense different types of input signals, e.g., thermocouple inputs, RTDs (resistance temperature detectors), currents, voltages, and resistance. In order to accomplish this, different types of sensing modules are employed to sense different types of input. A common approach is to utilize sensing modules that have a fixed number of input channels (e.g., 24) for receiving a particular type of input. For instance, a first set of sensing modules may be utilized for sensing N thermocouple inputs, a second set of sensing modules may be utilized for sensing M RTD inputs, etc.

However, because each sensing module is manufactured with a standard number of input channels, each sensing module will likely be deployed with unused input channels.

BRIEF DESCRIPTION OF THE INVENTION

A configurable input channel is provided capable of receiving one of several different input types in which the channel adjusts its span and input characteristics to match the input type.

In one embodiment, the invention provides a configurable input, comprising: an interface for implementing switch settings for a selected type of input signal; a set of input terminals, wherein at least two of the set of input terminals are selectively utilized to correspond with the selected type of input signal; an analog-to-digital converter for converting the selected type of input signal into a digital output, wherein an operation of the analog-to-digital converter is determined based on the switch settings; and an isolation barrier for isolating the configurable input channel.

In another embodiment, the invention provides a control system comprising: a plurality of configurable input channels for selectively receiving different analog sensor inputs, each configurable input channel comprising: an interface for implementing switch settings for a selected type of input signal; a set of input terminals, wherein at least two of the set of input terminals are selectively utilized to correspond with the selected type of input signal; an analog-to-digital converter for converting the selected type of input signal into a digital output, wherein an operation of the analog-to-digital converter is determined based on the switch settings; and an isolation barrier for isolating the configurable input channel.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 2 shows a table of input types and internal flows of the configurable input channel according to an embodiment of the invention; and FIG. 3A

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
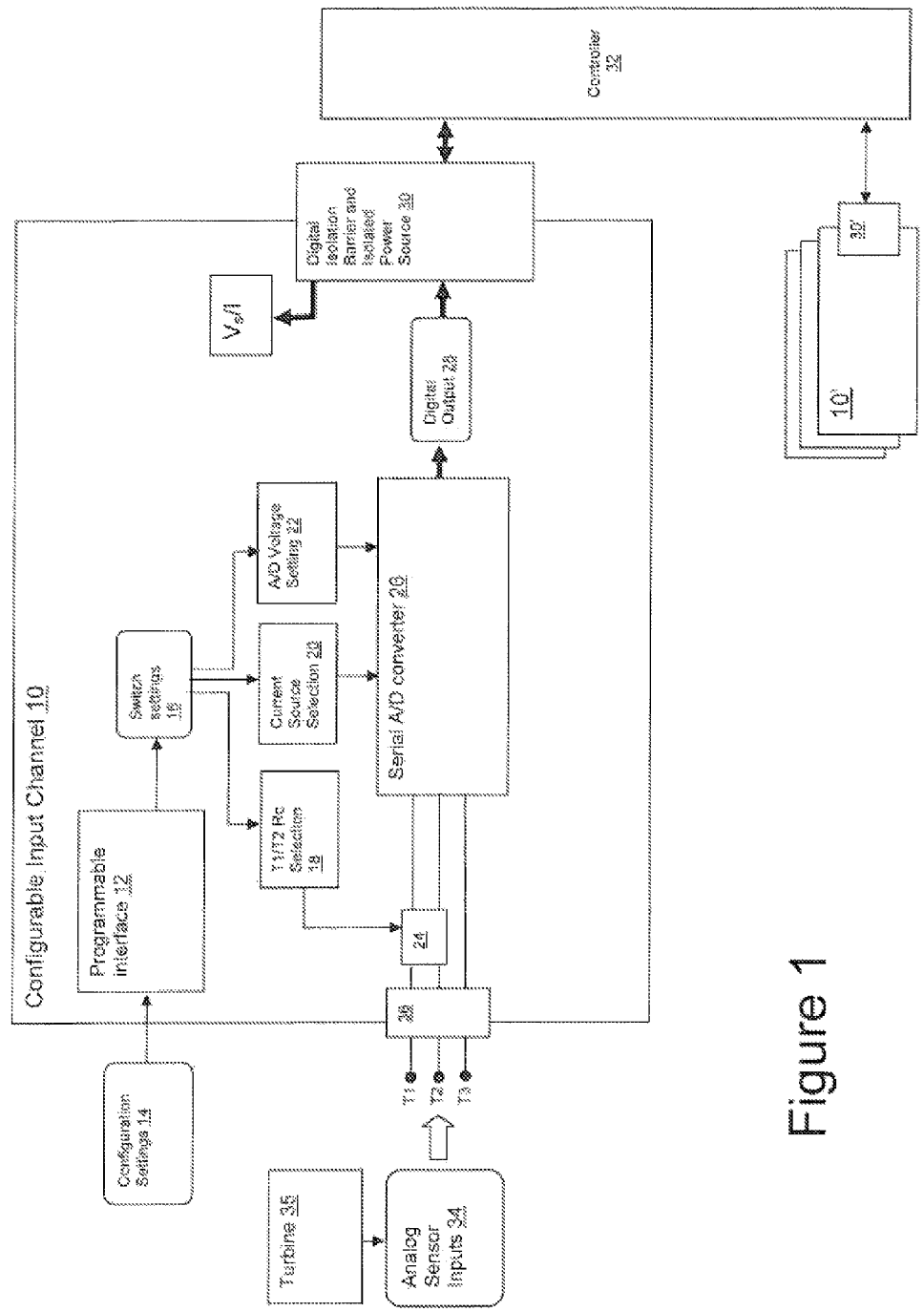
FIG. 1 shows a block diagram of a generalized architect of a configurable input channel according to an embodiment of the invention.

Referring now to the drawings, FIG. 1 depicts a generalized architecture of a configurable input channel 10 that can universally receive one of several different types of analog sensor inputs 34. Analog sensor inputs 34 are provided, e.g., via a twisted wire pair from a sensor located on a turbine 35. In this illustrative embodiment, configurable input channel 10 can be configured to receive one of a thermocouple input, an RTD input, a current loop input, or a voltage input. Configurable input channel 10 is configured for a particular type of analog sensor input 34 by: (1) inputting appropriate configuration settings 14 for a desired input type; and (2) connecting the analog sensor inputs to the appropriate terminals T1, T2 and/or T3.

Based on the configuration settings 14 and connections, analog sensor input 34 is processed in a particular manner and converted to a digital output 28, which is fed to a controller 32 via a digital isolation barrier and isolated power source 30. Controller 32 likewise receives digital data from a plurality of other configurable input channels 10' (each having its own digital isolation barrier and isolated power source 30'). Digital isolation barrier and isolated power source 30 provides galvanic or electrical isolation from other electrical components within a complete control system, thus satisfying the commercial requirement for point-isolated channels. Galvanic isolation is the principle of isolating functional sections of electric systems so that charge-carrying particles cannot move from one section to another, i.e., there is no electric current flowing directly from one channel 10 to the next 10'. Energy and/or information can still be exchanged between the channels by other means, such as by capacitance, induction, electromagnetic waves, optical, acoustic, or mechanical means.

Configurable input channel 10 includes a programmable interface 12 that implements switch settings 16 based on the inputted configuration settings 14, using, e.g., a switch control register. The switch settings 16 will internally configure the circuitry for processing a particular type of input. Note that rather than a programmable interface 12, manual jumpers could be utilized to implement switch settings 16.

Configurable input channel 10 includes three input terminals (T1, T2, T3), of which a predetermined two or three will be utilized for receiving an analog sensor input 34. FIG. 2 provides an illustrative table that shows which terminals are to be used for a given input. For instance, for a thermocouple or voltage input configuration, terminals T1 and T2 are utilized for V1 and V2 voltage inputs, and T3 is not utilized; for a current loop input configuration, T1 and T2 are utilized for a current input and a current output, respectively; and for an RTD input configuration, T1 is utilized for a first current (Current 1) output and a first voltage V1 input, T2 is utilized for a second current (Current 2) output and a second voltage V2 input, and T3 is utilized for a Current 1+Current 2 input and a third voltage V3 input.

Thus, depending on the input type, terminals T1, T2, T3 may be configured as simple input terminals (e.g., thermocouple, voltage), or be configured for both input and output (e.g., current loop, RTD). The table of FIG. 2 also provides channel switching and measurement calculations for the four different input types. It is understood that additional or a different combination of input types could likewise be implemented and fall within the scope of the invention.

As shown in the generalized example of FIG. 1, conversion of the analog sensor input 34 to a digital output 28 is obtained using circuitry including a serial A/D (analog-to-digital) converter 26. Use of serial A/D converter 26 provides for a channel that can be separately powered and isolated. Control within the channel is based on switch settings 16 for the A/D reference and input selections as well as programmable current sources. Switch settings 16 generally control: a T1/T2 Rc selection 18 for configuring a current sensing resistor 24 for T1 and T2; a current source selection 20; and an A/D voltage setting 22. Terminals T1, T2, T3 are separated from the configurable input channel 10 with a protection circuit 36.

Figure 3A:
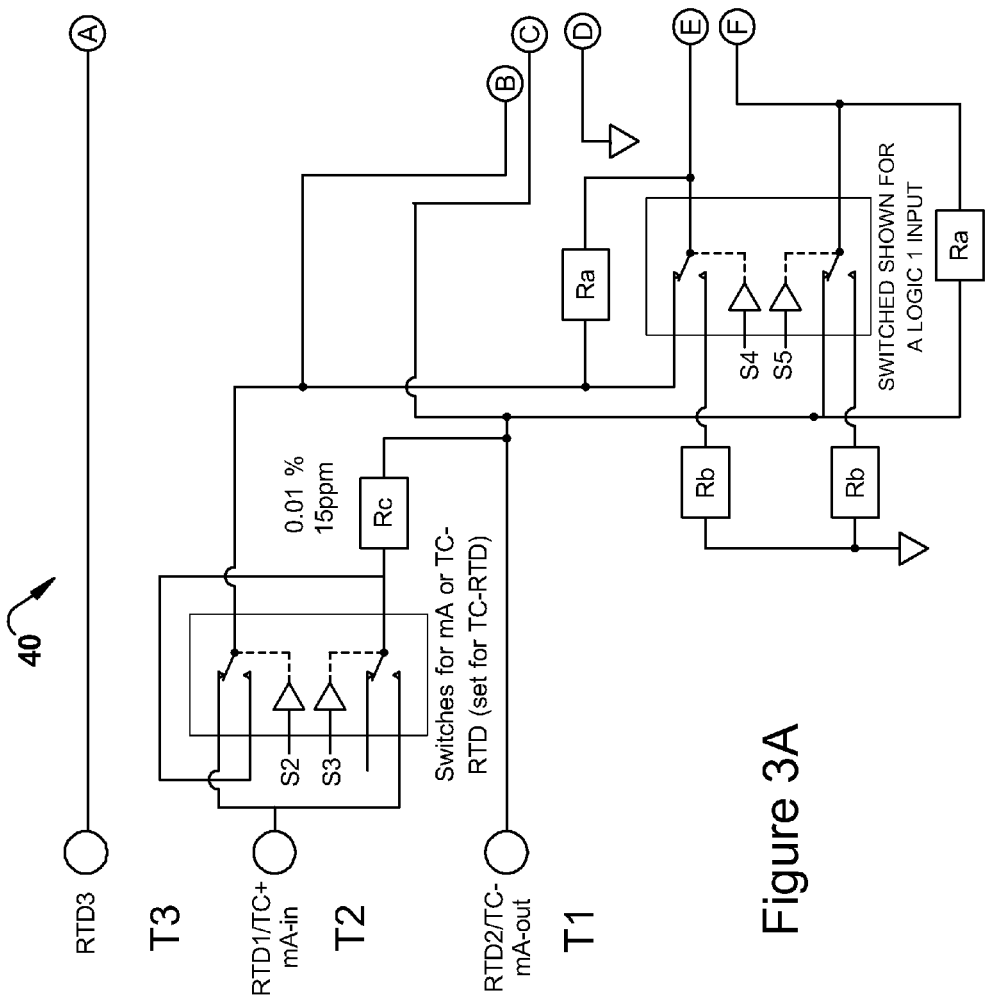
FIG. 3B shows an illustrative circuit for implementing a configurable input channel according to an embodiment of the invention.
Figure 3B:
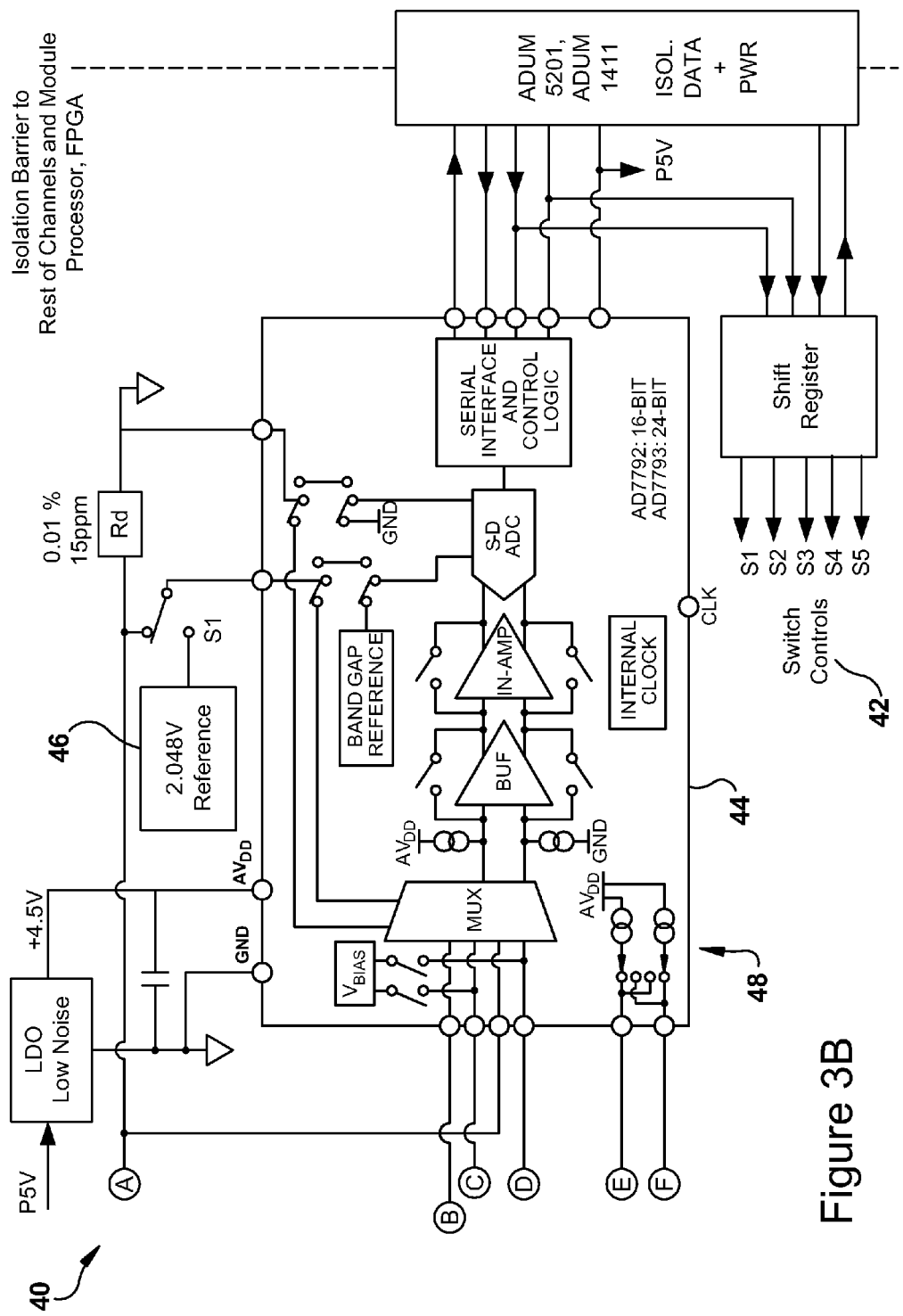

FIG. 3 depicts a more detailed example of a circuit 40 for implementing a configurable input channel. Note there are five switch controls S1-S5 42 in circuit 40, and switches S1-S5 are provided both internally to the serial A/D 44 and externally.

S1 selects the A/D reference either from a volt source 46 or from the voltage across a sensing resistor Rd. The sensing resistor connection is for RTD sensing, and provides a ratiometric reading. Resistor Rd is for example on the order of a hundred ohms.

S2 and S3 provide for the selection of a current sensing resistor Rc across terminals T1 and T2. Use of these two switches allows for the switch resistance to be compensated for within the circuit, whereas a single switch would add the unknown switch resistance to that of resistor Rc. The second switch allows the voltage sensing to be across the terminals or across resistor Rc. Resistor Rc is for example on the order of a hundred ohms.

S4 and S5 provide for current paths from a dual matched current source (within the A/D as shown, but may be a separate matched source). The two resistors Ra are used for the burnout pullup/pulldown voltages, where the current sources are selected to be active only on a single source (forcing a voltage on one of the resistors Rb for the pullup and a much lower voltage on the second resistor Rb due only to leakage currents giving a pulldown voltage). Resistors Ra are for example on the order of tens of megaohms, while resistors Rb are for example on the order of a thousand ohms.

Internal switches within the serial A/D 44 allow for: matched current source magnitudes and routing; input selection from four input pins; and voltage reference level and source.

Control of the switches and serial A/D 44 is via registers accessed by serial ports. Each channel has two ports—the A/D 44 with its internal registers both to write control settings and to read back data, and the switch control register. Each isolated channel is totally separate from the other channels—where the controlling device (e.g. microcontroller as in FIG. 1) has a quantity of serial channels to control. In an implementation, the SPI (serial peripheral interface) protocol with a clock, select, master to slave data, and slave to master data could be used. The multiple ports could share a common clock and master to slave data pair of signals, with the selects specifying which channel is being controlled as well as multiplexing the multiple slave to master data responses.

Additional circuitry not shown in FIG. 3 includes protection circuits on the terminals (e.g., low ohm resistors in series to limit currents through clamping diodes to the local isolated common) and a cold point measurement circuit (e.g., a digital sensor located adjacent to the terminals).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any related or incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A configurable input channel, comprising:
    an interface for implementing switch settings for a selected type of input signal;
    a set of input terminals, wherein at least two of the set of input terminals are selectively utilized to correspond with the selected type of input signal;
    an analog-to-digital converter for converting the selected type of input signal into a digital output, wherein an operation of the analog-to-digital converter is determined based on the switch settings; and
    an isolation barrier for isolating the configurable input channel.

2. The configurable input channel of claim 1, wherein the interface comprises a programmable interface.

3. The configurable input channel of claim 1, wherein the interface comprises a set of jumpers.

4. The configurable input channel of claim 1, wherein the selected type of input signal is one of a voltage input, a thermocouple input, a current loop input and an RTD (resistance temperature detector) input.

5. The configurable input channel of claim 4, wherein the set of input terminals includes a first terminal, a second terminal, and a third terminal, and:
    wherein the first and second terminals are utilized for voltage inputs for the thermocouple input and the voltage input;
    wherein the first and second terminals are utilized for a current input and a current output, respectively, for the current loop input; and
    wherein the first terminal is utilized for a first current output and a first voltage input, the second terminal is utilized for a second current output and a second voltage input, and the third terminal is utilized for a combination of the first current input and the second current input and a third voltage input for the RTD input.

6. The configurable input channel of claim 1, further comprising a first switch that selects an analog-to-digital reference either from a voltage source or from a voltage across a sensing resistor for an RTD (resistance temperature detector) input.

7. The configurable input channel of claim 1, further comprising a second and a third switch that select a current sensing resistor (Rc) across a first terminal and a second terminal.

8. The configurable input channel of claim 1, further comprising a fourth switch and a fifth switch that select current paths from a dual matched current source.

9. A control system comprising:
a plurality of configurable input channels for selectively receiving different analog sensor inputs, each configurable input channel comprising:
an interface for implementing switch settings for a selected type of input signal;
a set of input terminals, wherein at least two of the set of input terminals are selectively utilized to correspond with the selected type of input signal;
an analog-to-digital converter for converting the selected type of input signal into a digital output, wherein an operation of the analog-to-digital converter is determined based on the switch settings; and
an isolation barrier for isolating the configurable input channel.

10. The control system of claim 9, wherein the selected type of input signal is one of a voltage input, a thermocouple input, a current loop input and an RTD (resistance temperature detector) input.

11. The control system of claim 10, wherein the set of input terminals includes a first terminal, a second terminal, and a third terminal, and:
wherein the first and second terminals are utilized for voltage inputs for the thermocouple input and the voltage input;
wherein the first and second terminals are utilized for a current input and a current output, respectively, for the current loop input; and
wherein the first terminal is utilized for a first current output and a first voltage input, the second terminal is utilized for a second current output and a second voltage input, and the third terminal is utilized for a combination of the first current input and the second current input and a third voltage input for the RTD input.

12. The control system of claim 9, further comprising a first switch that selects an analog-to-digital reference either from a voltage source or from a voltage across a sensing resistor for RTD (Resistance Temperature Detector) input.

13. The control system of claim 9, further comprising a second and a third switch that select a current sensing resistor (Rc) across a first terminal and a second terminal.

14. The control system of claim 9, further comprising a fourth switch and a fifth switch that select current paths from a dual matched current source.

* * * * *